(12) United States Patent
Rezeq et al.

(10) Patent No.: US 7,761,068 B2
(45) Date of Patent: Jul. 20, 2010

(54) SYSTEM AND METHOD FOR A TIME ALIGNMENT ANALOG NOTCH

(75) Inventors: Sameh Sameer Rezeq, Dallas, TX (US); Khurram Waheed, Plano, TX (US); Sudheer Vemulapalli, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 732 days.

(21) Appl. No.: 11/728,227

(22) Filed: Mar. 23, 2007

(65) Prior Publication Data

US 2008/0233898 A1  Sep. 25, 2008

(51) Int. Cl.
*H01Q 11/12* (2006.01)
*H04B 1/04* (2006.01)

(52) U.S. Cl. .................................. 455/127.3; 330/280

(58) Field of Classification Search .............. 455/127.1, 455/127.2, 127.3, 93, 120, 127.4; 330/278, 330/280, 285, 296
See application file for complete search history.

(56) References Cited

U.S. PATENT DOCUMENTS

| 4,739,518 | A | 4/1988 | Bickley et al. |
| 5,132,797 | A | 7/1992 | Citta |
| 6,351,335 | B1 | 2/2002 | Perlin |
| 6,552,604 | B2 | 4/2003 | Cargille |
| 6,798,881 | B2 | 9/2004 | Thomasson |
| 2002/0137481 | A1* | 9/2002 | Chen et al. .................. 455/127 |

* cited by examiner

*Primary Examiner*—Nguyen Vo
(74) *Attorney, Agent, or Firm*—Ronald O. Neerings; Wade James Brady, III; Frederick J. Telecky, Jr.

(57) ABSTRACT

System and method for creating a time alignment analog notch. An embodiment includes a digital power amplifier coupled to an enable signal line and to a digital control bits bus, and a matching network coupled to the digital power amplifier. The matching network to provide impedance matching and the digital power amplifier to produce a current based on a value on the digital control bits bus. The digital power amplifier comprises a selection circuit and a plurality of transistors. The transistors, controlled by outputs of the selection circuit, provide a current based on the value on the digital control bits bus. The adjustment of a delay between a signal on the enable signal line and the values on the digital control bits bus creates an analog notch at about Fs/2, where Fs is a sampling frequency of a sigma-delta modulator used to modulate data provided to the digital power amplifier.

7 Claims, 5 Drawing Sheets

SYSTEM AND METHOD FOR A TIME ALIGNMENT ANALOG NOTCH

TECHNICAL FIELD

The present invention relates generally to a system and method for communications systems, and more particularly to a system and method for creating a time alignment analog notch.

BACKGROUND

Electronic devices continue to become smaller due to improvements in integration and overall system design. While the electronic devices continue to get smaller, their functionality continues to increase. For example, handheld wireless devices, such as cellular telephones, personal digital assistants (PDA), portable computers, pagers, and so forth, have begun to converge, wherein a single electronic device may have built-in cellular telephone, personal digital assistant, limited computing, paging, and so on, capabilities. Additionally, communications devices, such as cellular telephones, are now capable of communicating in multiple communications protocols and over different frequency bands.

The increased number of communications protocols and the different frequency bands utilized by the different communications protocols may present an interference problem. Transmissions and receptions at the various frequency bands using the different communications protocols may interfere with each other. For example, in a wireless device that may be capable of communicating in the Enhanced Data rates for GSM Evolution (EDGE) communications protocol and over the Personal Communications System (PCS) band, transmitting an EDGE signal in a first channel containing sigma-delta modulation, the noise shaping present in sigma-delta modulated data carried within the EDGE signal will result in a higher than permitted noise level in the Industrial, Scientific, and Medical (ISM) band.

Consequently, the noise shaping in the sigma-delta modulated data may need to be modified so that the interference caused in the ISM band is no longer an issue. Alternatively, comb filters may be added to help eliminate the noise shaping in the sigma-delta modulated data that is causing interference with the ISM band. However, the addition of the comb filter may negatively affect the resolution of the transmissions of the wireless device. For example, if the comb filter includes two fingers, the resolution may be decreased by a factor of two, plus there may be a one-delayed version of the data for which compensation must be provided, which may yield a loss in resolution of one bit. If the comb filter includes four fingers, then the resolution may be decreased by a factor of four and a three-delayed version of the data for which compensation must be provided, which may yield a loss in resolution of two bits.

SUMMARY OF THE INVENTION

These and other problems are generally solved or circumvented, and technical advantages are generally achieved, by embodiments of the present invention which provide a system and method for creating a time alignment analog notch.

In accordance with an embodiment, a circuit is provided. The circuit includes a digital power amplifier coupled to an enable signal line and to a digital control bits bus, and a matching network coupled to the digital power amplifier. The matching network provides impedance matching for the digital power amplifier. The digital power amplifier produces a current based on a value provided by the digital control bits bus, the digital power amplifier includes a selection circuit having a first input coupled to the digital control bus and a second input coupled to the enable signal line and a plurality of outputs, and a plurality of transistors, each transistor associated with an output of the selection circuit, each transistor having a control terminal coupled to an output of a logic gate. The selection circuit configured to provide an active signal at one or more of its outputs based on signal values provided at the first input and the second input.

In accordance with another embodiment, a wireless device is provided. The wireless device includes a controller to regulate the operation of the wireless device and to perform computations, a modem coupled to the controller, a radio frequency circuit coupled to the controller, and an amplifier coupled to the radio frequency unit. The modem modulates data to be transmitted by the wireless device, the radio frequency circuit converts a digital data stream into an analog signal and to mix the analog signal with a carrier signal, and the amplifier increases a signal level of the mixed analog signal to a level for transmission by an antenna. The amplifier includes a digital power amplifier to produce a current based on a value provided by a digital control bits bus when a clock signal provided a clock signal source is active. The digital power amplifier includes a plurality of logic gate and transistor pairs, each logic gate and transistor pair includes a logic gate coupled to the clock signal source and to the digital control bits bus, the logic gate logically combines the clock signal and a data value of the digital control bits bus, and a transistor having a control terminal coupled to an output of the logic gate, wherein the transistor regulates a current based on a value on the control terminal. The amplifier also includes a matching circuit coupled to the digital power amplifier, and a power amplifier coupled to the matching circuit. The matching circuit impedance matches the digital power amplifier, and the power amplifier increases the signal level of the current provided by the digital power amplifier.

In accordance with another embodiment, a method for adjusting an analog notch of an amplifier circuit is provided. The method includes setting a clock pulse delay to a specified value, setting a current frequency response to a measured frequency response of the amplifier circuit, incrementing the clock pulse delay, and setting a next frequency response to a measured frequency response of the amplifier circuit. The method also includes in response to a determination that the next frequency response is less than or equal to the current frequency response, setting the current frequency response to be equal to the next frequency response, and repeating the incrementing and the setting of the next frequency response.

An advantage of an embodiment is that the embodiment requires the addition of a small amount of simple hardware. Therefore, the implementation of the embodiment may be achieved rapidly with very little additional cost.

A further advantage of an embodiment is that the use of the embodiment can help to relax amplifier matching requirements, which may help to reduce the complexity and costs of the amplifier, thereby reducing the overall complexity and cost of an electronic device containing the amplifier.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a power amplifier for use in a wireless communications device. The invention may also be applied, however, to power amplifiers of other types of electronic devices (wired and wireless) wherein there is a desire to help reduce interference caused by the electronic device.

Figure 1A:
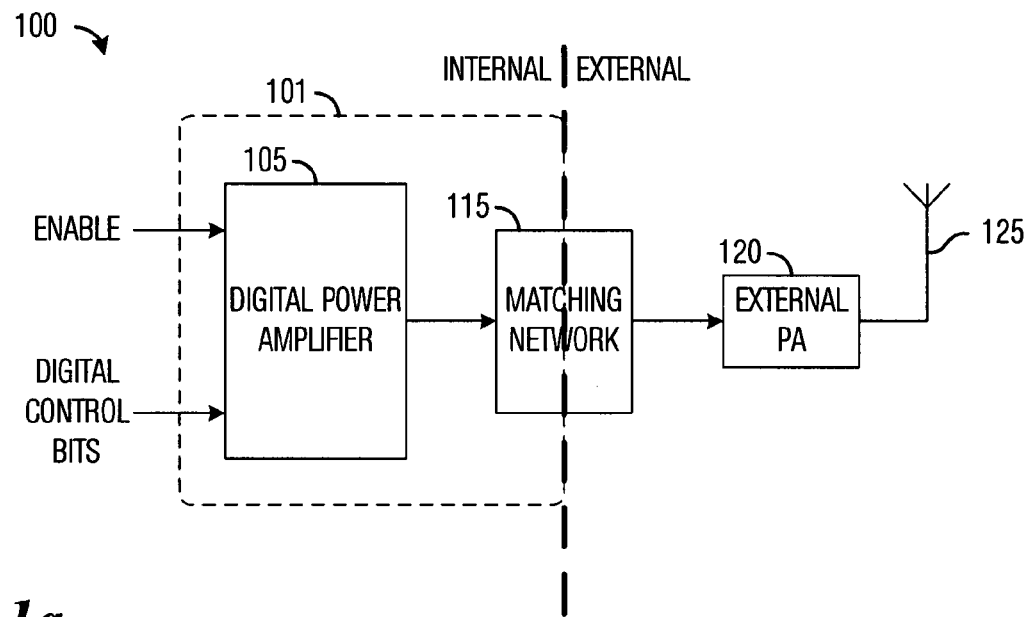
FIGS. 1a through 1c are diagrams of a signal amplification circuit.
Figure 1B:
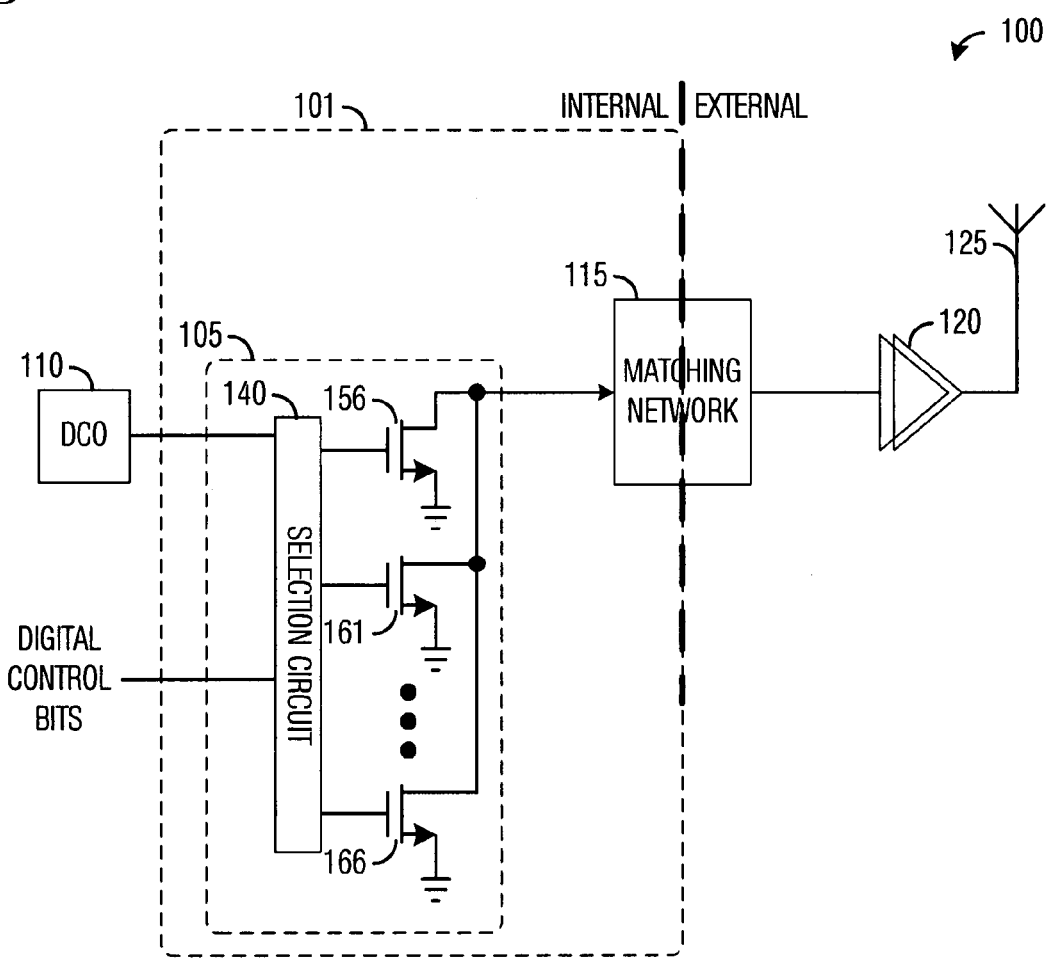
Figure 1C:
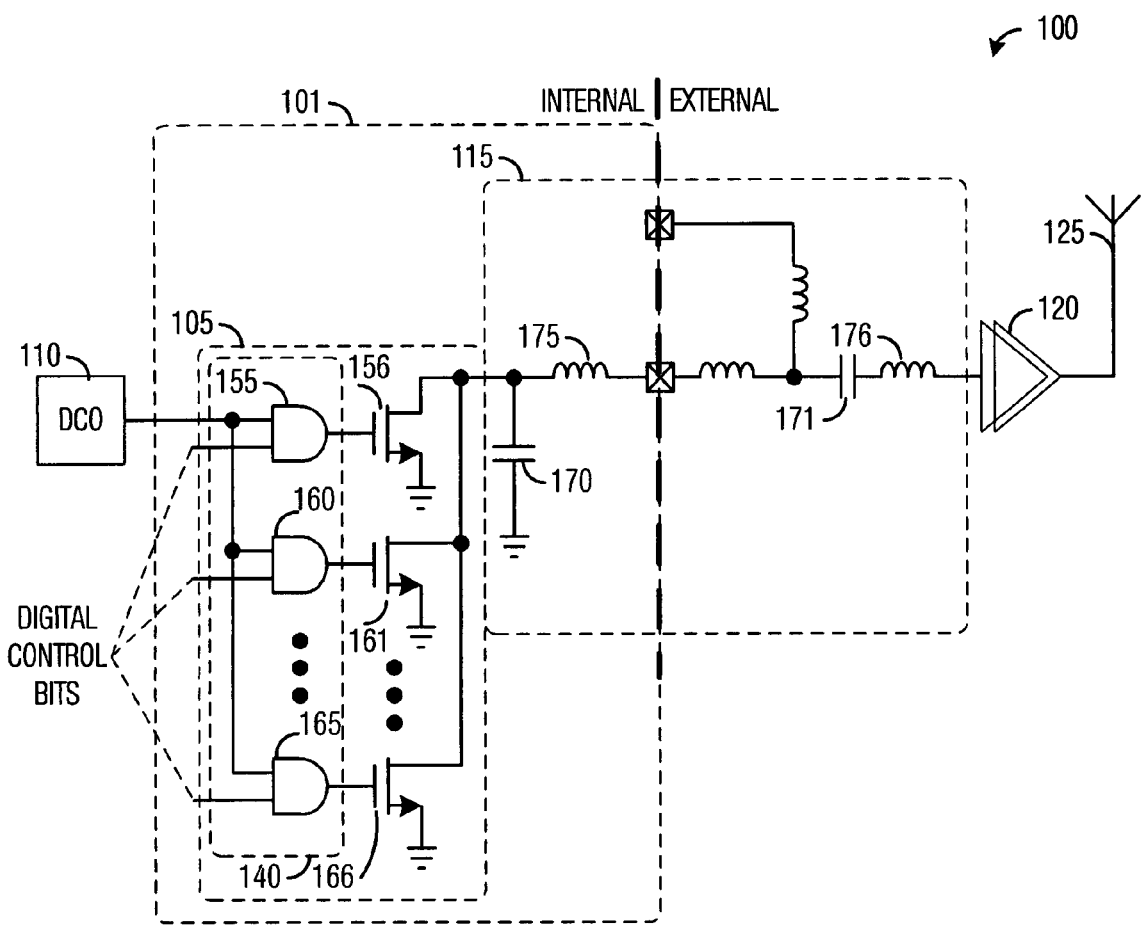

With reference now to FIGS. 1a through 1c, there are shown diagrams illustrating a high level view of a signal amplification circuit 100 containing a pre-power amplifier (PPA) and a detailed view of the signal amplification circuit 100 containing a PPA used in an exemplary wireless communications device. The signal amplification circuit 100 includes a PPA 101 along with other circuitry. The PPA 101 includes a digital power amplifier 105. The digital power amplifier 105 may be enabled by a signal on an enable signal line, such as a clock signal provided by a digitally controlled oscillator (DCO). The digital power amplifier 105 may be controlled by digital control bits, commonly referred to as amplitude control words (ACW), provided at its input. The ACW may specify a number of transistors to turn on or off. For example, if an ACW equal to five (5) is provided to the digital power amplifier 105, then five transistors in the digital power amplifier 105 may be turned on and each of the five transistors may pass a current that may be summed together and provided at an output of the digital power amplifier.

The PPA 101 also includes a matching network 115. The matching network 115 may include inductors, capacitors, resistors, and so forth, and may be used to provide necessary impedance matching between the digital power amplifier 105 of the PPA 101 and an external power amplifier 120 (a part of the signal amplification circuit 100). The external power amplifier 120 may amplify a signal provided by the matching network 115 to a signal level compatible for transmission by an antenna 125. The digital power amplifier 105, the DCO, and a portion of the matching network 115 may be integrated into an integrated circuit, while the external power amplifier 120 and the antenna 125 may be external to the integrated circuit but still a part of the wireless communications device. Additionally, the PPA 101 may be integrated into a single integrated circuit.

The digital power amplifier 105, as shown in FIG. 1b, may include a selection circuit 140 that may be used to select one or more transistors (for example, NMOS transistor 156, 161, or 166) based on the value of the ACW (as provided by the digital control bits input) at one of its inputs. In addition to the ACW, the selection circuit 140 may have at a second input a clock signal provided by a DCO 110. The clock signal provided by the DCO 110 may be used as an enable signal. The clock signal may function as an enable signal for the selection circuit 140, enabling the selection circuit 140 when the clock signal is active. For example, if the value of the ACW at an input to the selection circuit 140 is equal to four, then, for as long as the enable signal is active, the selection circuit 140 may select the transistors determined to be turned on when an ACW equal to four is provided to the digital power amplifier 105.

The selection circuit 140, as shown in FIG. 1c, may include a plurality of logic gates (for example, logical AND gate 155, 160, and 165). Each logic gate, such as logical AND gate 155, may be paired with a transistor, such as NMOS transistor 156. Other logic gate and transistor pairings may include logical AND gate 160 and NMOS transistor 161, and logical AND gate 165 and NMOS transistor 166. The digital power amplifier 105 may be manufactured using a deep sub-micron manufacturing process. Although the discussion focuses on logical AND gates and NMOS transistors, other types of logic gates, such as logical OR, logical exclusive-OR, logical NAND, logical NOR, and so forth, and transistors, such as PMOS, BJT, DMOS, and so on, may be used. Therefore, the discussion of AND gates and NMOS transistors should not be construed as being limiting to either the scope or the spirit of the present invention.

The logical AND gate 155 may have two inputs, with a first input coupled to an output of the DCO 110 and a second input coupled to a bus carrying the ACW. When the output of the DCO 110 is high, for example, and the ACW specifies the logical AND gate 155, for example, then an output of the logical AND gate 155 is high. The output of the logical AND gate 155 may be coupled to a gate terminal of the NMOS transistor 156 and when the output of the logical AND gate 155 is high, the NMOS transistor 156 is turned on, permitting a current to flow through the NMOS transistor 156. However, when either the output of the DCO 110 or the ACW specifying the logical AND gate 155 is low, then the output of the logical AND gate 155 is low and the NMOS transistor 156 is turned off. The other logical AND gate and NMOS transistor pairs may be similarly configured.

As discussed above, the matching network 115 may include capacitors (for example, capacitor 170 and 171), inductors (for example, inductor 175 and 176), as well as resistors, and so forth. Part of the matching network 115 may be integrated into an integrated circuit containing the digital power amplifier 105 and the DCO 110 and part of the matching network 115 may be external to the integrated circuit.

Figure 2:
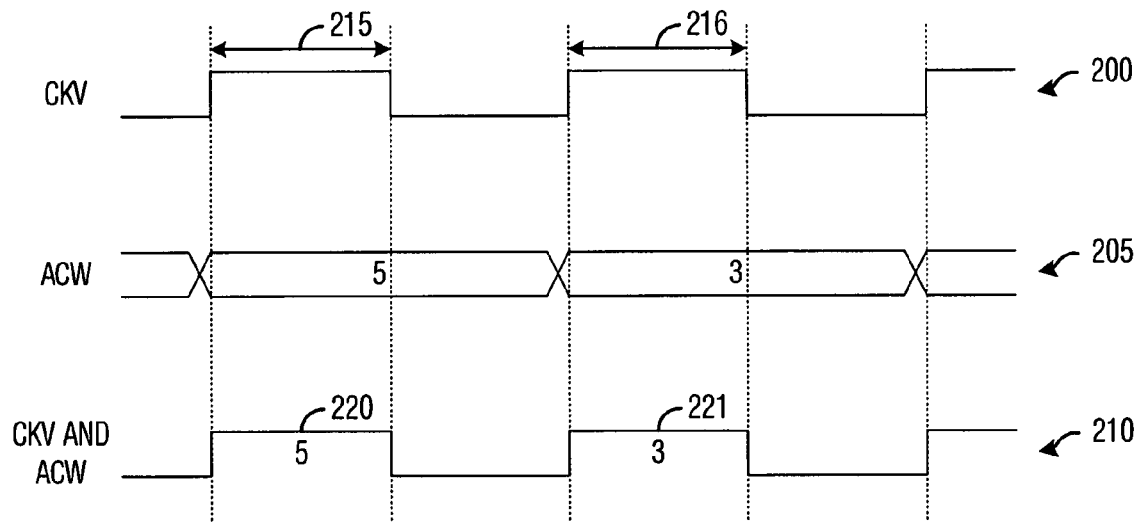
FIG. 2 is a diagram of signal traces of signal values at different points of a pre-power amplifier.

With reference now to FIG. 2, there is shown a diagram illustrating a plurality of signal traces displaying signal values at different points in an exemplary PPA. A first trace 200 displays signal values of a clock signal line, such as at a clock input of the digital power amplifier 105. A second trace 205 displays signal values of a digital control bits bus, such as at the digital control bits bus of the digital power amplifier 105. As such the signal values may represent the ACW being provided to the digital power amplifier 105. A third trace 210 displays a logical AND of the clock signal line and the digital control bits bus. The third trace 210 may display an output of the logical AND gate 155, for example, if the ACW specifies the logical AND gate 155. When the value of the clock signal line is high (active high), for example, during intervals 215 and 216, then the third trace 210 may track the second trace 205. The number displayed in the third trace 210 while it is high indicates that the outputs of the AND gates in the digital power amplifier 105 associated with the particular ACW are high. For example, during an interval 220, the third trace 210 is labeled "5," indicating that outputs of AND gates associated with an ACW of "5" are high. Similarly, during an interval 221, the outputs of AND gates associated with an ACW of "3" are high.

The traces shown in FIG. 2 illustrate a situation wherein the rising and falling edges of the signal carried on the clock signal line (the first trace 200) occur at precisely when the ACW stabilize on the digital control bits bus (the second trace 205). In practice, it may be difficult to achieve precise (or nearly precise) alignment between different signals. However, by inserting a delay between the occurrence of the rising and falling edges of the signal on the clock signal line and the time when the ACW stabilizes on the digital control bits bus, it may be possible to create an averaging function that may create an attenuation of the output of the PPA 101. The attenuation may be more pronounced at certain delays.

The averaging function may be a by-product of the switching on and off of the transistors, such as transistor 156, 161, and 166, of the digital power amplifier 105. When a transistor is turned on for a period of time, a current produced by the transistor may be accumulated and then may be released subsequent to when the transistor is turned off. The on and off switching of the transistors may be analogous to generating a sine wave with the accumulating (accumulating is integration over time) and releasing of the transistor's current. When the number of transistors turned on is changed in the middle of the accumulation process, due to a change in the ACW, the accumulated transistor current may then be an average number of transistors that are turned on.

Figure 3A:
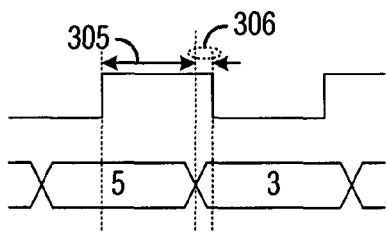
FIGS. 3a through 3l are diagrams of different delay timings between a clock signal and consecutive amplitude control words and data plots of corresponding frequency responses of a pre-power amplifier.
Figure 3B:
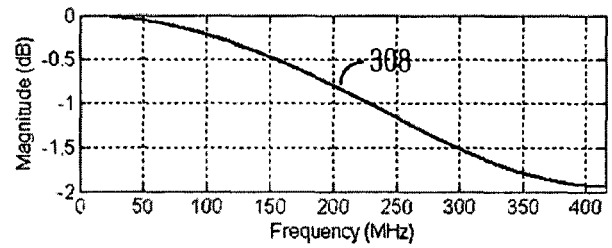

With reference now to FIGS. 3a through 3m, there are shown diagrams illustrating a relationship between a delayed clock and consecutive ACWs and corresponding frequency response of a PPA. Also shown is a diagram illustrating a comparison of noise shaping in a sigma-delta modulator and a frequency response of a PPA with an analog notch located at one-half of the sampling frequency, with the sigma-delta modulator sampling data at a frequency (Fs) of about 832 MHz. The diagram shown in FIG. 3a illustrates a trace of a clock signal and a trace of a digital control bits bus, wherein the clock signal is delayed so that approximately 90% of an interval (shown as interval 305) when the clock is active occurs during an first ACW value and 10% of an interval (shown as interval 306) when the clock is active occurs during a second ACW value. The diagram shown in FIG. 3b illustrates a plot of the frequency response of a PPA, such as the PPA 101, with the clock signal delayed so that the clock signal is active for about 90% of the first ACW value and about 10% of the second ACW value. A trace 308 illustrates the frequency response of the PPA 101. The trace 308 shows that the frequency response of the PPA 101 drops off gradually from about 25 MHz to about 416 MHz (about Fs/2 of the sampling rate of the sigma-delta modulator used to modulate the data being processed by the PPA 101). The maximum attenuation at about 416 MHz is approximately 2 dB. The discussion focuses on an exemplary PPA and sigma-delta modulator configuration with a sampling frequency of about 823 MHz. These values are for discussion purposes only and should not be considered to be limiting to either the spirit or the scope of the present invention.

Figure 3C:
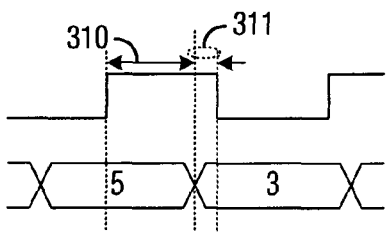
Figure 3D:
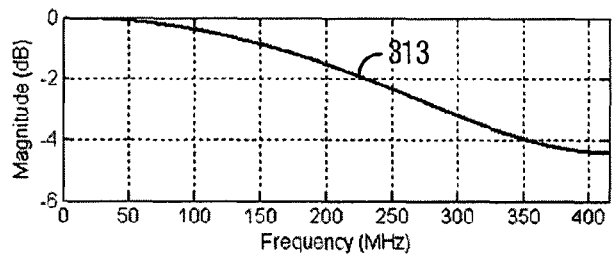

The diagram shown in FIG. 3c illustrates a trace of a clock signal and a trace of a digital control bits bus, wherein the clock signal is delayed so that approximately 80% of an interval (shown as interval 310) when the clock is active occurs during an first ACW value and 20% of an interval (shown as interval 311) when the clock is active occurs during a second ACW value. The diagram shown in FIG. 3d illustrates a plot of the frequency response of the PPA 101 with the clock signal delayed so that the clock signal is active for about 80% of the first ACW value and about 20% of the second ACW value. A trace 313 shows that the frequency response of the PPA 101 drops off gradually from about 25 MHz to about 416 MHz. However, the drop-off is faster than the drop-off shown in FIG. 3b and with a larger maximum attenuation of more than 4 dB.

Figure 3E:
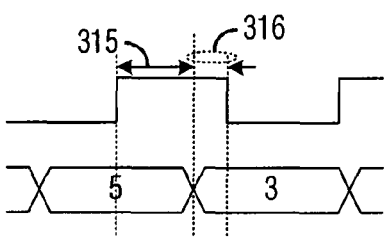
Figure 3F:
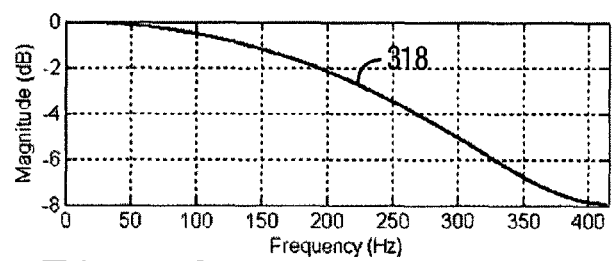

The diagram shown in FIG. 3e illustrates a trace of a clock signal and a trace of a digital control bits bus, wherein the clock signal is delayed so that approximately 70% of an interval (shown as interval 315) when the clock is active occurs during an first ACW value and 30% of an interval (shown as interval 316) when the clock is active occurs during a second ACW value. The diagram shown in FIG. 3f illustrates a plot of the frequency response of the PPA 101 with the clock signal delayed so that the clock signal is active for about 70% of the first ACW value and about 30% of the second ACW value. A trace 318 shows that the frequency response of the PPA 101 drops off rapidly from about 25 MHz to about 416 MHz, with a maximum attenuation of about 8 dB.

Figure 3G:
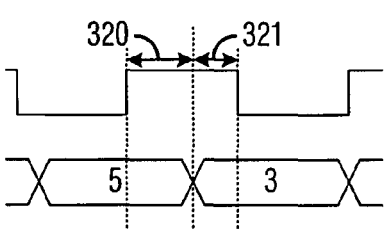
Figure 3H:
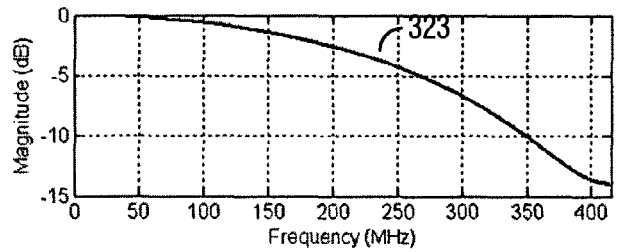

The diagram shown in FIG. 3g illustrates a trace of a clock signal and a trace of a digital control bits bus, wherein the clock signal is delayed so that approximately 60% of an interval (shown as interval 320) when the clock is active occurs during an first ACW value and 40% of an interval (shown as interval 321) when the clock is active occurs during a second ACW value. The diagram shown in FIG. 3h illustrates a plot of the frequency response of the PPA 101 with the clock signal delayed so that the clock signal is active for about 60% of the first ACW value and about 40% of the second ACW value. A trace 323 shows that the frequency response of the PPA 101 drops off rapidly from about 25 MHz to about 416 MHz, with a maximum attenuation of about 14 dB.

Figure 3I:
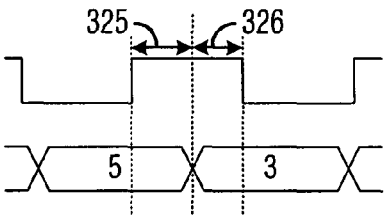
Figure 3J:
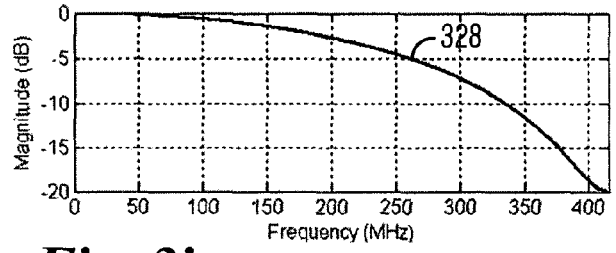

The diagram shown in FIG. 3i illustrates a trace of a clock signal and a trace of a digital control bits bus, wherein the clock signal is delayed so that approximately 55% of an interval (shown as interval 325) when the clock is active occurs during an first ACW value and 45% of an interval (shown as interval 326) when the clock is active occurs during a second ACW value. The diagram shown in FIG. 3j illustrates a plot of the frequency response of the PPA 101 with the clock signal delayed so that the clock signal is active for about 55% of the first ACW value and about 45% of the second ACW value. A trace 328 shows that the frequency response of the PPA 101 drops off rapidly from about 25 MHz to about 416 MHz, with a maximum attenuation of about 20 dB.

Figure 3K:
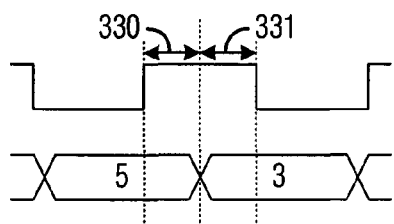
Figure 3L:
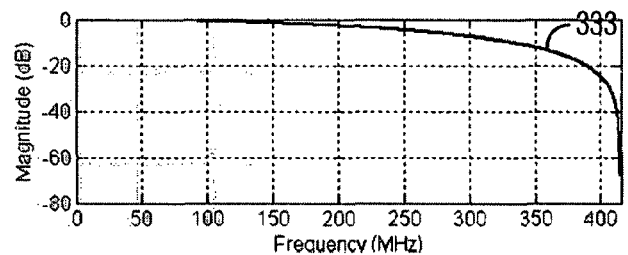

The diagram shown in FIG. 3k illustrates a trace of a clock signal and a trace of a digital control bits bus, wherein the clock signal is delayed so that approximately 50% of an interval (shown as interval 330) when the clock is active occurs during an first ACW value and 50% of an interval (shown as interval 331) when the clock is active occurs during a second ACW value. The diagram shown in FIG. 3l illustrates a plot of the frequency response of the PPA 101 with the clock signal delayed so that the clock signal is active for about 50% of the first ACW value and about 50% of the second ACW value. A trace 333 shows that the frequency response of the PPA 101 drops off rapidly from about 100 MHz to about 416 MHz, with a maximum attenuation of about 70 dB.

Figure 3M:
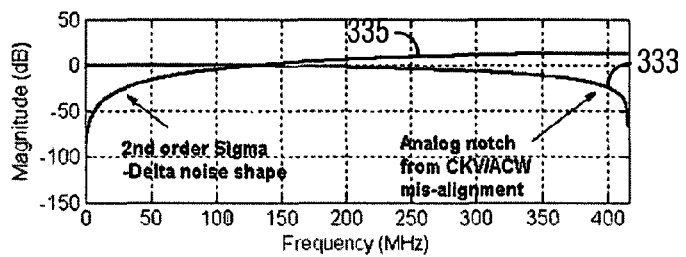
FIG. 3m is a diagram of a comparison of noise shaping in a sigma-delta modulator and a frequency response of a pre-power amplifier.

The diagram shown in FIG. 3m illustrates the trace 333, the frequency response of the PPA with the clock signal delayed so that the clock signal is active for about 50% of the first ACW value and about 50% of the second ACW value, and a trace 335 of the noise shaping response of a second order sigma-delta modulator with a sampling rate (Fs) of 832 MHz. The analog notch created at about Fs/2 by the averaging performed on the output of the PPA 101 may help to eliminate any interference caused by the noise shaping response of the second order sigma-delta modulator on nearby frequency bands.

Figure 4A:
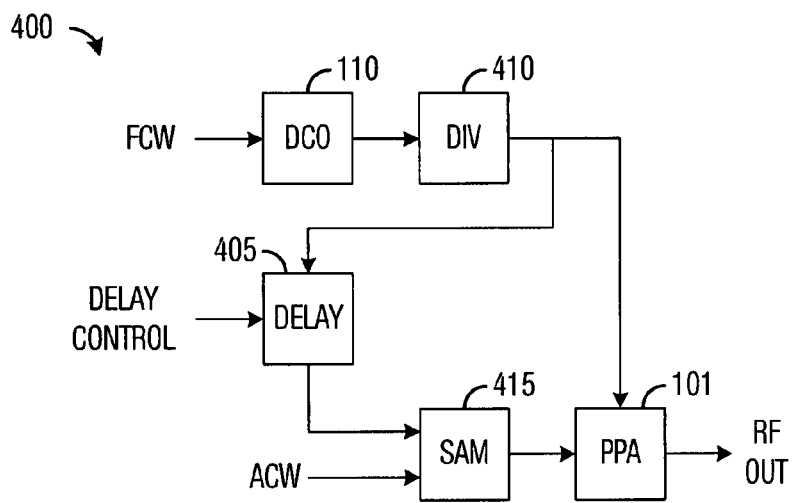
FIGS. 4a and 4b are diagrams of a system for controlling a delay of a clock and a detailed view of a delay sequence.
Figure 4B:
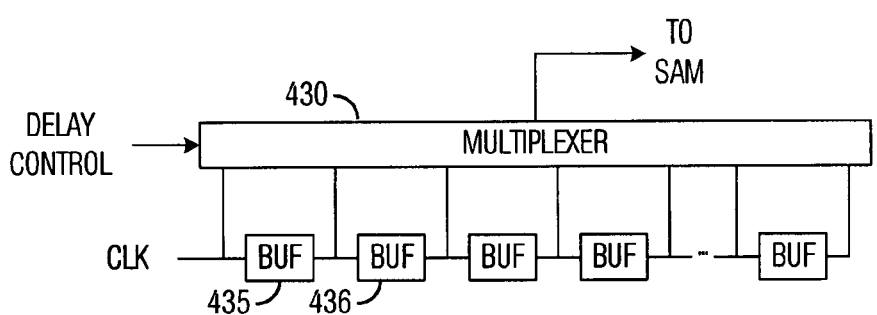

With reference now to FIGS. 4a and 4b, there are shown diagrams illustrating a schematic of a system 400 for controlling a delay of a clock to creating an analog notch located at about Fs/2 in an output of a PPA and a detailed view of a delay sequence. The system 400 includes a delay block 405. The delay block 405 may be used to insert a variable delay, responsive to a delay control, into a clock signal generated by the DCO 110. The clock signal, generated by the DCO 110, may be divided by a divider (DIV) 410 to create a clock signal with a desired period.

The delayed clock signal (output from the delay block 405) may then be provided to a sigma-delta amplitude modulation (SAM) block 415. The SAM block 415 produces sigma-delta amplitude modulated ACW that are sampled at the frequency of the clock signal. The SAM block 415 may apply a sigma-delta dithering on the ACW to decrease the number of transistors needed in the PPA 101 while helping to maintain the narrow band resolution. For example, if the number of bits in the ACW is six (6), then 36 transistors may be needed to represent all possible combinations of the ACW (assuming that all transistors have the same weight). The SAM block 415 may be able to dither the six bits into a one bit value that may be handled by a single transistor in the PPA 101. A side effect of the SAM block 415 may be the noise shaping inherent in sigma-delta modulators. The sampled and sigma-delta modulated ACW may then be provided to the PPA 101, wherein they may be used to control the operation of the digital power amplifier 105 as discussed previously.

The diagram shown in FIG. 4b illustrates a detailed view of the delay block 405. The delay block 405 includes a multiplexer 430 having a number of inputs. A linear sequence of buffers, such as buffer 435 and 436, may be used to insert a delay into the clock signal. Each buffer may insert a fixed delay into the clock signal. For example, an output of the buffer 435 may be the clock signal plus a single delay, while an output of the buffer 436 may be the clock signal plus two delays. The delay control signal may control the multiplexer 430 and selects the appropriately delayed clock signal. If the linear sequence of buffers has N buffers, then the multiplexer 430 should have N+1 inputs, one for the clock signal and then one each for the N buffers.

Figure 5:
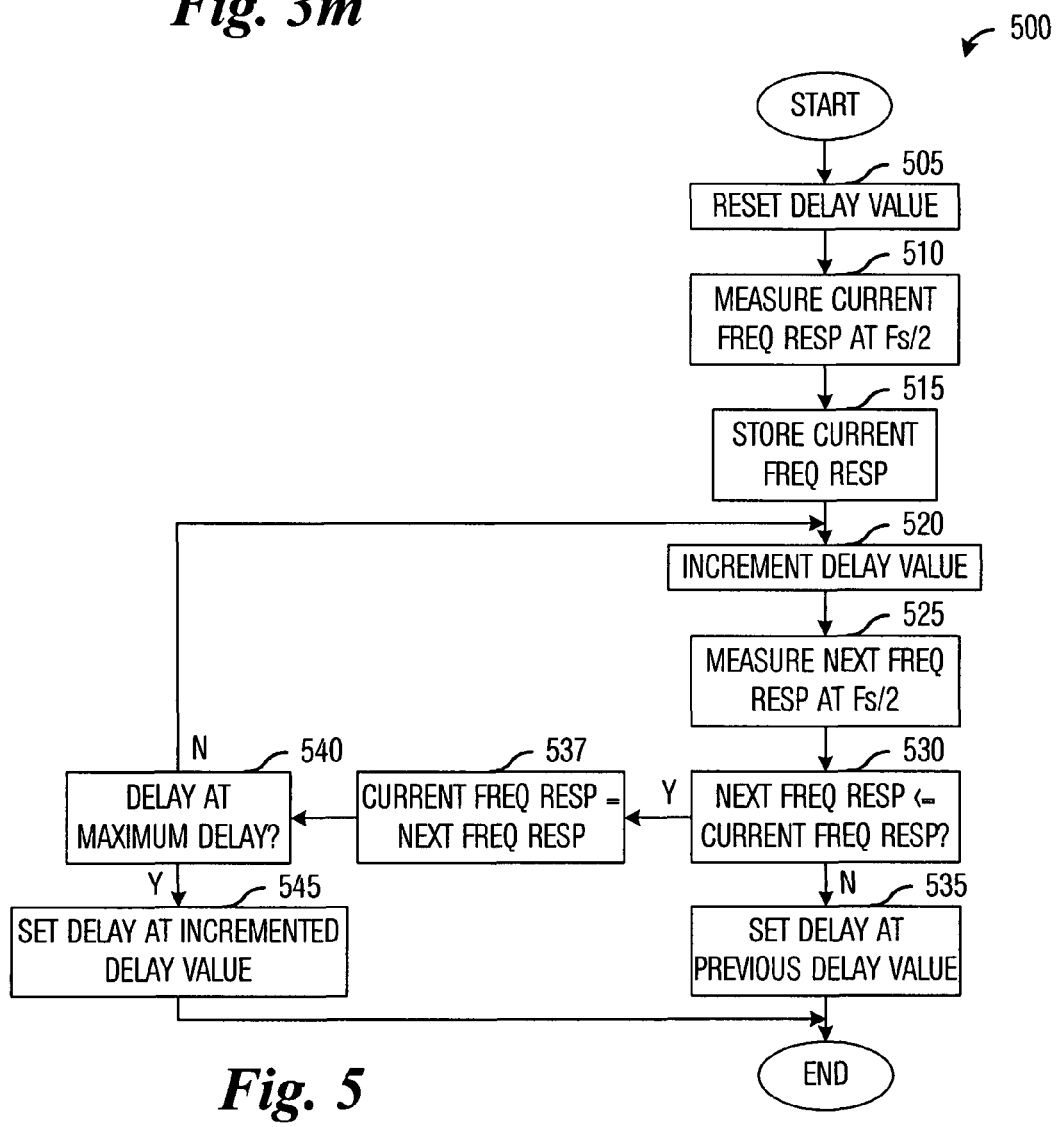
FIG. 5 is a diagram of a sequence of events in adjusting a delay of a clock.

With reference now to FIG. 5, there is shown a diagram illustrating a sequence of events 500 in adjusting a delay inserted into a clock signal to maximize an analog notch located at about Fs/2 in an output of a PPA. The adjusting of the delay inserted into the clock signal to maximize an analog notch located at about Fs/2 may begin with a resetting of a previously set delay, which may result in the setting of a delay about equal to zero (or some prespecified value) into the clock signal (block 505). For example, an estimate of a possible starting point for a delay may be stored in a memory. The estimate may be based on an expected duration of the clock cycle and an expected duration of ACW values on a digital control bits bus. The estimate may be computed by a manufacturer of the PPA 101 or a designer of a particular implementation of the PPA 101.

With the delay reset or set to a prespecified value, the delay may be inserted into the clock signal of the PPA 101, for example, through the use of the delay block 405. A frequency response of the output of the PPA 101 may then be measured, with particular emphasis placed on the frequency response at and about Fs/2 (block 510). The frequency response may then be stored (block 515). The delay may then be incremented (block 520), by a specified value or, if utilizing the delay block 405, by a single buffer delay, for example. With the delay changed, the delay may be inserted into the clock signal of the PPA 101 and the frequency response once again measured (block 525).

A comparison may be made with the newly measured frequency response and the previously stored frequency response, with the comparison being made at and about the frequency Fs/2 (block 530). For example, the comparison may determine if the newly measured frequency response is less than or equal to the previously stored frequency response. If the newly measured frequency response is not less than or equal to the previously stored frequency response, then the delay for the PPA 101 should be set at the delay that was used to produced the previously stored frequency response (block 535). If the newly measured frequency response is less than or equal to the previously stored frequency response, then the previously stored frequency response may be set to the newly measured frequency response (block 537) and a determination may be made to determine if the delay is set at the maximum delay value (block 540). If the delay is the maximum delay value, then delay for the PPA 101 should be set as the incremented delay value (block 545).

If the delay is not the maximum delay value, then the delay may be incremented (block 520), and the delay may be inserted into the clock signal of the PPA 101 and a measurement of the resulting frequency response may be taken (block 525). The comparison with the previously stored frequency response may be repeated (block 530). The sequence of events may be repeated until a delay that results in a minimum frequency response at and about Fs/2 is found or until the delay is set to the maximum delay value.

Figure 6:
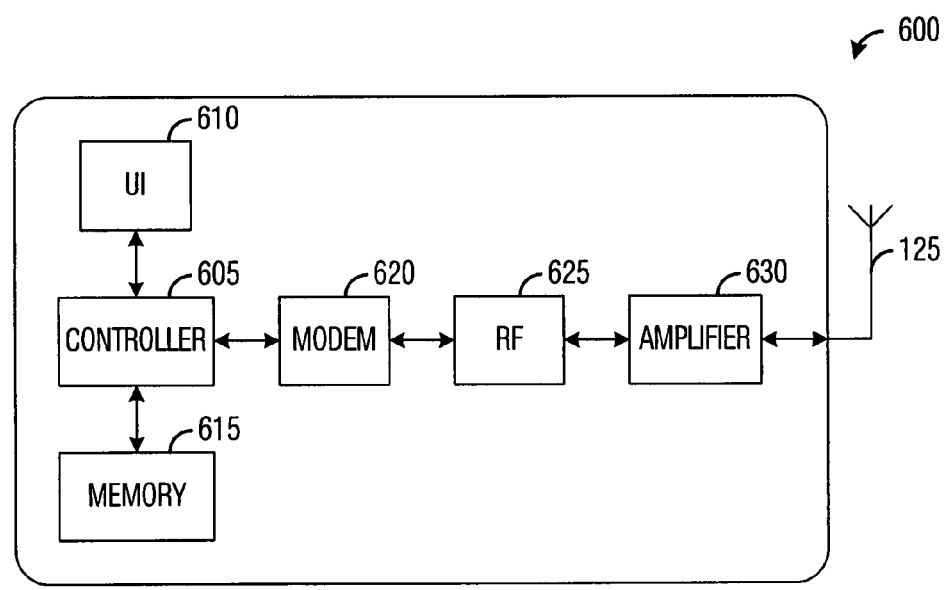
FIG. 6 is a diagram of a wireless communications device.

With reference now to FIG. 6, there is shown a diagram illustrating an exemplary wireless communications device 600. The wireless communications device 600 may be a cellular telephone or it may be a multi-function device that may include a cellular telephone, a pager, a computer, and so forth. The wireless communications device 600 may include a controller 605. The controller 605 may be implemented using a microcontroller, a general purpose processing unit, a custom designed integrated circuit, or so on. The controller 605 may be used to provide necessary processing and computing power needed by the wireless communications device 600 and its user. Additionally, the controller 605 may be used to execute programs and applications, control the operation of the wireless communications device 600, and so forth.

The wireless communications device 600 may also include a user interface (UI) unit 610, which may be responsible with interfacing the wireless communications device 600 with its user. For example, the UI unit 610 may render a graphical user interface, accept user input via a keypad, touch sensitive screen, or so forth, as well as play music, and so on. A memory 615 may be used to store programs, applications, and data, as well as provide a scratch area for the intermediate storage of computations performed by the controller 605.

To communicate wirelessly, the wireless communications device 600 may include a modem 620, a radio frequency (RF) unit 625, an amplifier unit 630, and an antenna 125. The modem 620 may be responsible for modulating (encode) and demodulating (decode) data based on a communications standard so that the wireless communications device 600 may communicate with other devices. For example, the modem 620 may modulate data created by the controller 605 so that the data may be transmitted to another communications device. The modem 620 may add error correction and error detection information to the data. The RF unit 625 may take the modulated data from the modem 620 and perform signal processing on the modulated data to prepare it for transmission, such as converting the modulated data into an analog signal, mixing the analog signal to an appropriate frequency, and so forth, and the amplifier 630 may be used to increase the signal level of the processed and modulated data so that it may be possible to transmit the data over-the-air by the antenna 125. The amplifier 630 may include an implementation of the signal amplification circuit 100 as shown in FIGS. 1a and 1b. A similar, but reversed set of operations may be utilized for data received by the wireless communications device 600.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A wireless device comprising:
   a controller configured to regulate the operation of the wireless device and to perform computations;
   a modem coupled to the controller, the modem configured to modulate data to be transmitted by the wireless device;
   a radio frequency circuit coupled to the controller, the radio frequency circuit configured to convert a digital data stream into an analog signal and to mix the analog signal with a carrier signal; and
   an amplifier coupled to the radio frequency unit, the amplifier configured to increase a signal level of the mixed analog signal to a level for transmission by an antenna, the amplifier comprising,
      a digital power amplifier to produce a current based on a value provided by a digital control bits bus when a clock signal provided a clock signal source is active, the digital power amplifier comprising,
         a plurality of logic gate and transistor pairs, each logic gate and transistor pair comprising
            a logic gate coupled to the clock signal source and to the digital control bits bus, the logic gate configured to logically combine the clock signal and a data value of the digital control bits bus; and
            a transistor having a control terminal coupled to an output of the logic gate, the transistor to regulate a current based on a value on the control terminal,
      a matching circuit coupled to the digital power amplifier, the matching circuit configured to impedance match the digital power amplifier, and
      a power amplifier coupled to the matching circuit, the power amplifier to increase the signal level of the current provided by the digital power amplifier.

2. The wireless device of claim 1, further comprising:
   a memory coupled to the controller, the memory to store programs and data; and
   a user interface unit coupled to the controller, the user interface unit configured to accept user input.

3. The wireless device of claim 1, wherein the amplifier further comprises a variable delay unit coupled to the digital power amplifier, the variable delay unit configured to insert a delay in the clock signal.

4. The wireless device of claim 3, wherein the variable delay unit comprises:
   a linearly coupled sequence of delay elements with a first delay element having the clock signal as input; and
   a multiplexer having N+1 inputs, where N is a number of delay elements in the linearly connected sequence of delay elements, a first input is connected to the clock signal and each of the remaining N inputs is connected an output of a single delay element, the multiplexer also having a control input to selectively couple an input to an output of the multiplexer.

5. The wireless device of claim 3, wherein amplitude control words are transmitted over the digital control bits, wherein an amplitude control word specifies a number of transistors to be turned on, and wherein the delay inserted in the clock signal so that there is a misalignment between when the clock signal is active and a transition in consecutive amplitude control words creates a notch in a frequency response of the output of the digital power amplifier.

6. The wireless device of claim 5, wherein the modem uses a sigma-delta modulator to modulate data to be transmitted, and wherein the notch in the frequency response is located at about Fs/2, where Fs is the sampling frequency of the sigma-delta modulator.

7. The wireless device of claim 1, wherein the modem modulates data using an Enhanced Data rates for GSM Evolution (EDGE) communications protocol, and wherein the wireless device transmits in a Personal Communications System (PCS) band.

* * * * *